(12) United States Patent
Bodenhausen et al.

(10) Patent No.: US 9,086,465 B2
(45) Date of Patent: Jul. 21, 2015

(54) FOURIER TICKLING FOR HOMONUCLEAR DECOUPLING IN NMR

(75) Inventors: Geoffrey Bodenhausen, Paris (FR); Diego Carnevale, Lausanne (CH)

(73) Assignees: Bruker BioSpin AG, Faellanden (CH); Ecole Polytechnique Fédérate de Lausanne EPFL-TTO, Lausanna (CH)

( * ) Notice: Subject to any disclaimer, the term of this patent is extended or adjusted under 35 U.S.C. 154(b) by 571 days.

(21) Appl. No.: 13/545,995

(22) Filed: Jul. 11, 2012

(65) Prior Publication Data
US 2013/0021031 A1 Jan. 24, 2013

(30) Foreign Application Priority Data

Jul. 18, 2011 (EP) .................... 11174360

(51) Int. Cl.
G01V 3/00 (2006.01)
G01R 33/46 (2006.01)
G01R 33/58 (2006.01)

(52) U.S. Cl.
CPC .......... *G01R 33/4608* (2013.01); *G01R 33/583* (2013.01)

(58) Field of Classification Search
CPC .................................... G01R 33/583
USPC ......................... 324/314, 307, 309
See application file for complete search history.

(56) References Cited

U.S. PATENT DOCUMENTS

| | | | |
|---|---|---|---|
| 3,787,760 A * | 1/1974 | Keller et al. ................. | 324/311 |
| 4,774,467 A * | 9/1988 | Sorensen .................... | 324/311 |
| 2013/0090884 A1* | 4/2013 | Glaser et al. ................ | 702/104 |
| 2013/0257425 A1* | 10/2013 | Struppe et al. ............... | 324/309 |

OTHER PUBLICATIONS

Bloom, A.L. et al., "Effects of Perturbing Radiofrequency Fields on Nuclear Spin Coupling" Phys. Rev. 97, 1955, 1261.
Freeman, R. et al. "Use of Weak Perturbing Radio-Frequency Fields in Nuclear Magnetic Double Resonance" J. Chem. Phys. 37, 1962, 2053.
Anderson W.A. et al., "Influence of a Second Radiofrequency Field on High-Resolution Nuclear Magnetic Resonance Spectra" J. Chem. Phys. 37, 1962, 85.
Freemann, R. et al., "Line Profiles in Nuclear Magnetic Double Resonance" J. Chem. Phys. 46, 1967, 1125.
Bloch, F. et al. "Magnetic Resonance for Nonrotating Fields" Phys. Rev., 1940, 57, 522.
Jesson, J.P. et al., "Homonuclear Decoupling and Peak Elimination in Fourier Transform Nuclear Magnetic Resonance", Journal of the American Chemical Society, vol. 95, No. 2, 1973, pp. 618-620.
Chapter 4: One-Dimensional Fourier Spectroscopy: "Section 4.7.5: Time shared decoupling", In: Ernst R. et al.: "Principles of Nuclear Magnetic Resonance in One and Two Dimensions", 1994, Oxford University Press, United Kingdom.

* cited by examiner

Primary Examiner — Louis Arana
(74) Attorney, Agent, or Firm — Paul Vincent

(57) ABSTRACT

A method for high resolution NMR (=nuclear magnetic resonance) measurements using the application of excitation pulses and the acquisition of data points, whereby a dwell time $\Delta t$ separates the acquisition of two consecutive data points, which is characterized in that one or more tickling rf (=radio frequency) pulses of duration $\tau_p$ are applied within each dwell time $\Delta t$, and that the average rf field amplitude of each of the tickling rf pulses approximately fulfills the condition $\langle \omega_1 \rangle = \omega_1 \tau_p / \Delta t = \pi J$ wherein J is the scalar J-coupling constant and $\omega_1 = \gamma B_1$ with $\gamma$ being the gyromagnetic ratio and $B_1$ being the strength of the magnetic component of each tickling rf pulse. This method is effective in decoupling homonuclear couplings.

7 Claims, 13 Drawing Sheets

FOURIER TICKLING FOR HOMONUCLEAR DECOUPLING IN NMR

This application claims Paris Convention priority of EP 11 174 360.5 filed Jul. 18, 2011 the entire disclosure of which is hereby incorporated by reference.

BACKGROUND OF THE INVENTION

The invention concerns a method for high resolution NMR (=nuclear magnetic resonance) measurements comprising the application of excitation pulses and the acquisition of data points, whereby a dwell time $\Delta t$ separates the acquisition of two consecutive data points. A method as described above is known from Andrew E. Derome, "Modern NMR Techniques for Chemistry Research", Pergamon Press, 1987.

Double-resonance techniques were first introduced into high-resolution CW-NMR by Bloch in 1954.[1] Bloom and Shoolery[2] have shown that the application of an rf field B2 to $^{31}$P nuclei such that $\gamma B_2 \gg 2\pi|J|$ can lead to the collapse of the doublet in the $^{19}$F spectrum arising from a heteronuclear coupling $J(^{31}P-^{19}F)$. Freeman and Anderson[3, 4]proposed a theoretical description that is applicable to spin systems with either homo- or heteronuclear couplings and explains the spectral complexities and multiplicities arising from the secondary rf field $B_2$ while sweeping the frequency of the main rf field $B_1$ to observe the response in CW (=continuous wave) fashion. In particular, information about the topology of non-degenerate energy levels and the relative signs of coupling constants can be extracted.[5, 6] A detailed discussion of these effects, which have later become known as "spin tickling" experiments, has been presented elsewhere.[7, 8] Ever since, the development of advanced methods for the characterization of more and more complex systems (often in biomolecules) has been accompanied by a desire to achieve a gain in resolution and spectral simplification. The removal of homonuclear scalar interactions can simplify assignments in overlapping regions in both 1D and 2D spectra, and a number of methods have been proposed to eliminate the fine structure due to J-couplings.[9-15] However, none of these methods appear to have found widespread applications. Moreover, they usually only achieve a decoupling effect in the indirect dimension of 2D spectra. A method similar to the above is known as homonuclear decoupling, where a weak rf field of constant amplitude is applied throughout the observation of the signal. This method suffers from problems of interference between rf irradiation and signal observation, and is difficult to extend to multiple frequencies.

The object of the present invention is to present an effective and fast method of decoupling of homonuclear couplings.

SUMMARY OF THE INVENTION

This object is achieved by that one or more tickling rf (=radio frequency) pulses of duration $\tau_p$ are applied within each dwell time $\Delta t$, and that the average rf field amplitude of each of the tickling rf pulses is between $\langle \omega_1 \rangle = \omega_1 \tau_p/\Delta t = \pi/10 J$ and $\langle \omega_1 \rangle = \omega_1 \tau p/\Delta t = 10\pi J$, wherein J being the scalar J-coupling constant and $\omega_1 = \gamma B_1$ with $\gamma$ being the gyromagnetic ratio and $B_1$ being the strength of the magnetic component of each tickling rf pulse. Decoupling of homonuclear scalar interactions in J-coupled spin systems in high-resolution NMR spectra of solutions can be achieved by applying brief but fairly intense radio-frequency (rf) "tickling" pulses in the intervals (dwell times) between the acquisition of data points. The average rf field amplitude, i.e., the peak amplitude scaled by the duty cycle, should approximately satisfy the condition $\langle \omega_1 \rangle \approx \pi J$. It is considered sufficient if $\langle \omega_1 \rangle$ is between $(\pi/10)J$ and $10\pi J$ for the method to work. The method is effective over a wide range of chemical shift differences between the J-coupled pairs of nuclei.

This invention presents a 1D technique to remove homonuclear scalar interactions by applying a train of brief rf-pulses. This method may be seen as a combination of Fourier and tickling spectroscopy. In the spirit of self-deprecating acronyms such as INEPT and INADEQUATE, we like to refer to our method as Window-Acquired Spin Tickling Experiment (WASTE). The new method has been tested on proton spectra of a series of samples ranging from moderately strongly- to weakly-coupled spin systems.

A preferred variant of the inventive method is characterized in that the average rf field amplitude of each of the tickling rf pulses fulfils the condition: $\langle \omega_1 \rangle = \omega_1 \tau_p/\Delta t = \pi J$.

While the method seems to work properly with values of $\langle \omega_1 \rangle$ only approximately reaching $\pi J$, $\langle \omega_1 \rangle = \pi J$ is found to be the optimal condition.

A further advantageous variant of the inventive method is characterized in that the duration $\tau_p$ of the tickling pulses is between 0.1 μs and 20 μs, preferably about 1 μs. Tickling rf pulses of shorter or longer duration appear to lead to unwanted side effects.

It is advantageous if the data points, which are acquired once in every dwell time, are transformed into a spectrum by a Fourier transformation.

In another preferred variant of the inventive method M tickling rf pulses of duration $\tau_p$ are applied at will within each of multiple dwell times $\Delta t$, each tickling rf pulse within each dwell time $\Delta t$ belongs to a different comb $C_m$ of tickling rf pulses, with m being a positive integer and $1 \le m \le M$, and all tickling rf pulses belonging to the same comb $C_m$ are equidistant to each other.

Multiple tickling pulses can be applied within each dwell time and grouped into combs, within which the tickling rf pulses are equidistant to each other.

A further variation of this variant is characterized in that the phase of each tickling rf pulse belonging to the same comb $C_m$ is shifted from one dwell time to the next by a constant factor. This variant allows for simultaneous decoupling of several spin systems.

The invention is shown in the drawing:

DESCRIPTION OF THE PREFERRED EMBODIMENT

Figure 1:
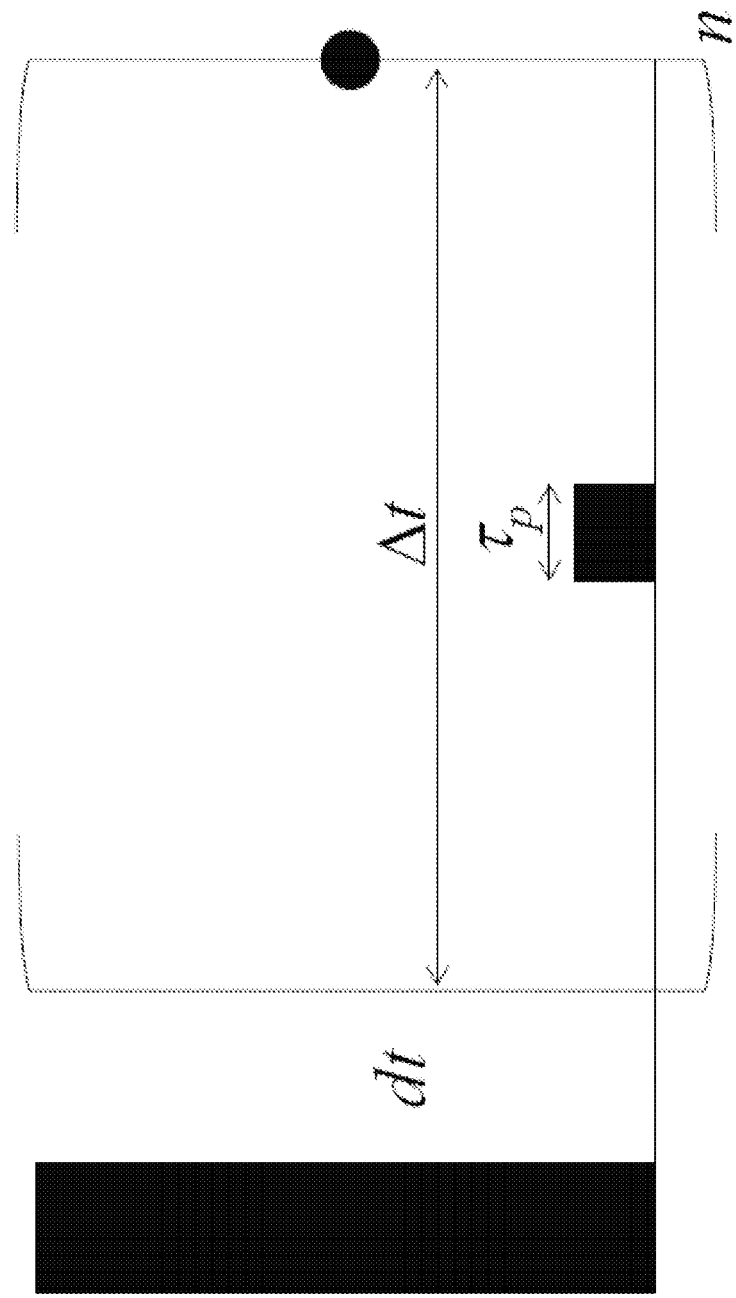
FIG. 1 A scheme for Fourier tickling experiments, showing the application of a tickling rf pulse.

FIG. 1 shows a scheme for Fourier tickling experiments. The tall rectangle represents the initial excitation pulse whereas the small rectangle represents a tickling pulse of duration $\tau_p$ applied along the x axis. The black dot represents the acquisition of a single data point. If the receiver runs continuously, this data point is obtained by averaging over all data points acquired in the interval during which the receiver is activated. The Driven Induction Decay (DID) is built up by acquiring n data points through an n-fold repetition of the loop.

Decoupling of homonuclear scalar interactions $J_{AX}$ in coupled spin systems can be achieved by applying brief but fairly intense radio-frequency (rf) "tickling" pulses (typically with a duration $\tau_p=1$ µs and an rf amplitude $2<\omega_1/(2\pi)<3$ kHz) between the acquisition of data points. These are separated by intervals ("dwell times") that may be typically $\Delta t=100$ µs if the desired spectral width is 10 kHz. As will be explained below, the average rf field amplitude $\langle \omega_1 \rangle = \omega_1 \tau_p/\Delta t$ should approximately satisfy the condition $\langle \omega_1 \rangle = \pi J$. If one "tickles" spin A by placing the carrier frequency of on the chemical shift $\Omega_A$, the fine-structure due to $J_{AX}$ collapses in both A and X multiplets. In "linear" AMX three-spin systems with $J_{AX}=0$ Hz, tickling the central spin M eliminates both interactions $J_{AM}$ and $J_{MX}$. As a result, all three multiplets collapse and the spectrum shows only three singlets at the isotropic chemical shifts $\Omega_A$, $\Omega_M$ and •$\Omega_X$. However, in a general AMX three-spin system with if $J_{MX}\neq 0$ where only spin M is tickled, the multiplicity due to $J_{AX}$ is retained for both non-irradiated A and X spins.

In the sequence shown in FIG. 1, we consider the case where the phases of the initial 90° pulse and the tickling pulses are along the y and x axes, respectively. As usual in Fourier spectroscopy, the signal is observed at regular intervals $\Delta t$ (dwell times) that are inversely proportional to the desired spectral width, so as to fulfil the Nyquist condition. A tickling pulse of length $\tau_p$ and constant rf amplitude $\omega_1=\gamma B_1$ is applied near the middle of each $\Delta t$ interval. A so-called Driven Induction Decay (DID) can be acquired by repeating the loop n times until one obtains the desired number of points. Numerical simulations have been performed with the SIMPSON program.[16] Relaxation effects have not been taken into account in this study. The rf carrier of the tickling pulses is set on resonance with the spin A, i.e. $\omega_{rf}=\omega_A$, so that its offset vanishes, $\Omega_A=\Omega_A-\Omega_{rf}=0$. Therefore, in the Zeeman frame rotating in synchronism with $\Omega_{rf}=\Omega_A$, the Hamiltonian is:

$$H_{Tot} = \Omega_X I_z^X + 2\pi J I^A I^X + \omega_1(t)(I_x^A + I_x^X),$$

where the third term vanishes except during the tickling pulse.

Figure 2:
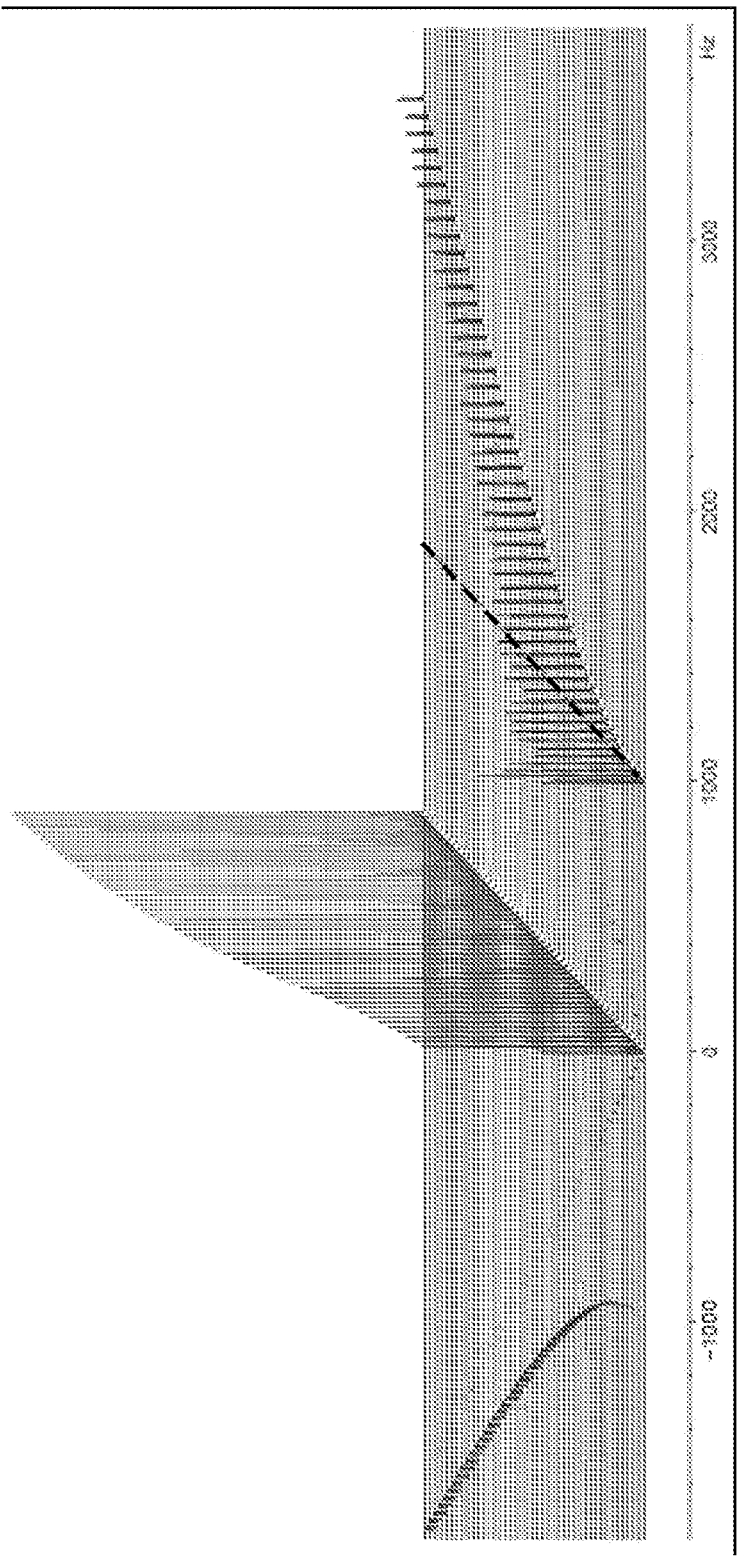
FIG. 2 Simulated tickling spectra stacked from bottom to top as the pulse length $\tau_p$ is progressively increased in steps of 2 μs until continuous spin locking is achieved.

FIG. 2 shows a simulated tickling spectrum stacked from bottom to top as the pulse length $\tau_p$ is progressively increased in steps of 2 μs until continuous spin locking is achieved. The rf field strength is $\omega_1/(2\pi)=2.5$ kHz. The offsets are $\Omega_A/(2\pi)=0$ Hz and $\Omega_X/(2\pi)=1$ kHz, the coupling constant is $J_{AX}=10$ Hz. The offset of spin X is indicated by a dashed line. All spectra were processed with 1 Hz line broadening because the on-resonance line would otherwise be very narrow and tall.

The evolution of the density matrix can be evaluated numerically using the Liouville-von Neumann equation.[17] In FIG. 2 we explored the effect of the length $\tau_p$ of the tickling pulses by progressively increasing the pulse length $\tau_p$ while keeping the dwell time $\Delta t$ constant. As the length $\tau_p$ of the tickling pulse is increased, signals appear that are symmetrically disposed on either side of the signal of the on-resonance spin A at $\Omega_A=0$ Hz. The offset of the off-resonance spin X is also perturbed, and appears to be "pushed away" from the carrier frequency. This is a manifestation of the Bloch-Siegert effect.[18-20] The apparent chemical shift is:

$$\Omega_X^{App} = \sqrt{\Omega_X^2 + \langle\omega_1\rangle^2} = \Omega_X\sqrt{1 + \frac{\langle\omega_1\rangle^2}{\Omega_X^2}}.$$

Taking the first two terms of a series expansion around $\langle\omega_1\rangle/\Omega_X=0$ yields, since $\langle\omega_1\rangle<<\Omega_X$:

$$\Omega_X^{App} \approx \Omega_X\left(1 + \frac{1}{2}\frac{\langle\omega_1\rangle^2}{\Omega_X^2}\right) = \Omega_X + \frac{\langle\omega_1\rangle^2}{2\Omega_X},$$

where the ratio $\langle\omega_1\rangle^2/(2\Omega_X)$ gives the systematic error in rad/s. Typically, we may have an rf duty cycle $\tau p/\Delta t=0.01=1\%$ if $\tau_p=1$ μs and $\Delta t=100$ μs for a spectral width of 10 kHz. If we consider an rf amplitude $\omega_1/(2\pi)=2.5$ kHz and coupling partners with offsets $\Omega_X/(2\pi)>1$ kHz (i.e., above 2 ppm at 500 MHz, or beyond 1 ppm at 1 GHz), we have systematic errors:

$$0 < \langle\omega_1\rangle^2/(4\pi\Omega_X) < 0.3125 \text{ Hz.} \tag{3}$$

In other words, the apparent offset of the off-resonance spin X is barely perturbed. If desired, the apparent chemical shifts observed in tickling spectra may be corrected for these Bloch-Siegert effects:

$$\Omega_X \approx \Omega_X^{App}/[1+\langle\omega_1\rangle^2/(2\Omega_X^2)] \approx \Omega_X^{App}/[1+\langle\omega_1\rangle^2/(2(\Omega_X^{App})^2)], \tag{4}$$

where we have simply replaced $\Omega_X$ by $\Omega_X^{App}$ on the right-hand side. The signals that appear in a symmetrical position with respect to the carrier frequency in FIG. 2 can be explained by the fact that the projection of the trajectory of the magnetization on the equatorial plane of the rotating frame is elliptical (in contrast to the circular trajectory that prevails in the absence of a tickling field) so that is can be decomposed into two counter-rotating components with unequal amplitudes. If $\Omega_1 >> \Omega_X$, the evolution of the magnetization associated with both spins would be completely suppressed in the limit of continuous irradiation when $\langle\omega_1\rangle=\omega_1$ (spin-locking), so that one expects a single unmodulated signal at $\Omega_A=0$ Hz. The top spectra in FIG. 2 approach this limiting case, where the two spins are in effect magnetically equivalent.

Figure 3:
FIG. 3 Simulated tickling spectra stacked as in FIG. 2, but with smaller increments 0.25 μs of the pulse length $0 \le \tau_p \le 2.25$ μs. The best decoupling occurs when $\tau_p = 1$ μs (fifth spectrum from the bottom)

As can be seen in FIG. 3, which shows a partial enlargement of FIG. 2, an ideal decoupling effect is achieved for both resonances when the tickling pulse length is $\tau_p=1$ μs. If the pulses have a decreasing duration $\tau_p$ each singlet appears to be flanked by two "tickling sidebands" with increasing amplitude. Note that the multiplet structures of both on- and off-resonance spins A and X remain remarkably similar for $0 \leq \tau_p \leq 2.25$ μs.

Figure 4:
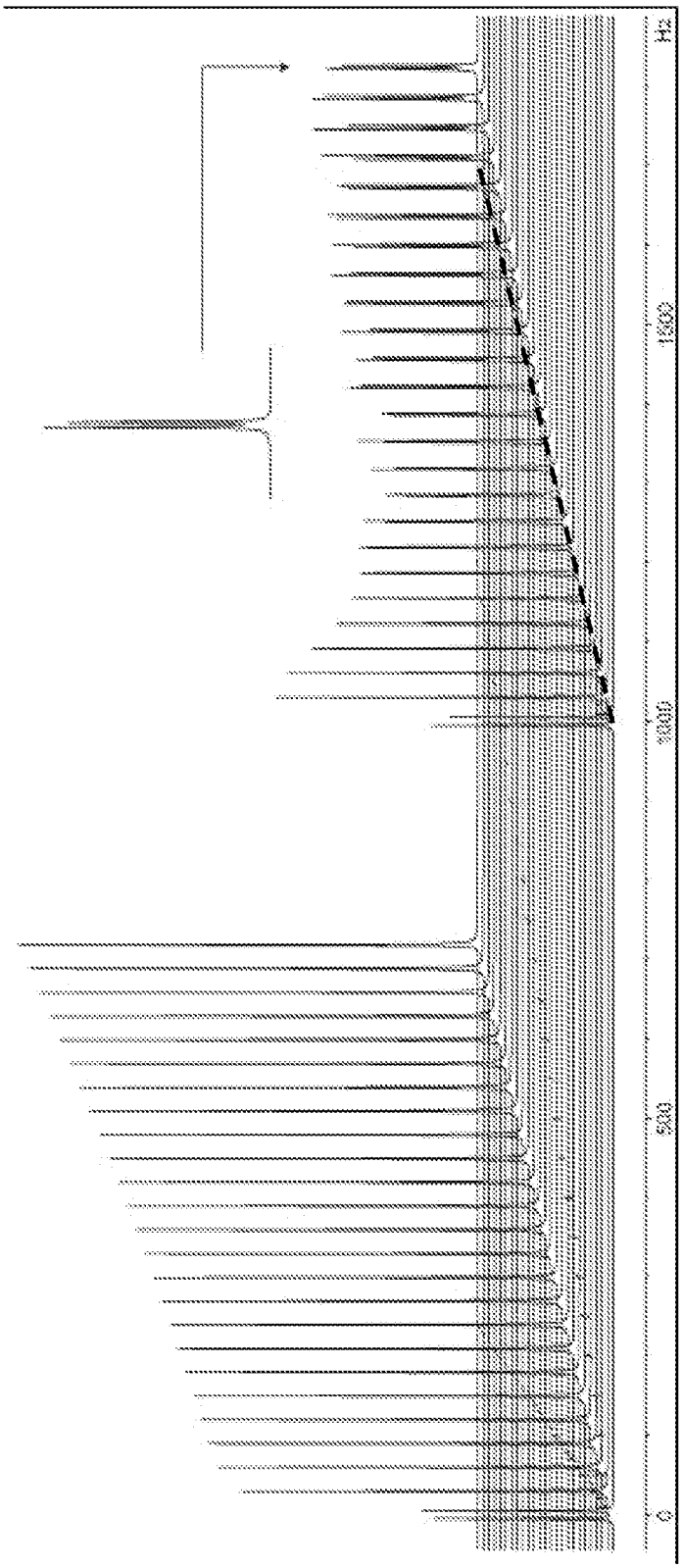
FIG. 4 Set of simulated spectra stacked from bottom to top as the rf field strength of the tickling pulses is increased over the range $0 \le \omega_1/(2\pi) \le 50$ kHz in 25 steps of 2 kHz. The tickling-pulse length is $\tau_p = 1$ μs (duty cycle 1%), the offset $\Omega_X/(2\pi) = 1$ kHz, and the coupling constant $J_{AX} = 10$ Hz. The true offset of spin X is indicated by the dashed line.

The role of the rf field strength was further investigated by simulations, as shown in FIG. 4. The tickling pulse length was kept fixed at $\tau_p=1$ μs and offset $\Omega_X/(2\pi)=1$ kHz while the field strength was progressively increased in the range $0 \leq \omega_1/(2\pi) \leq 50$ kHz. While the A spin resonance appears neatly decoupled regardless of the rf field strength, the off-resonance X spin shows a misleading splitting as the rf field strength is increased beyond 12 kHz. The distortion of the X spin resonance becomes worse as the rf field strength is increased.

Figure 5:
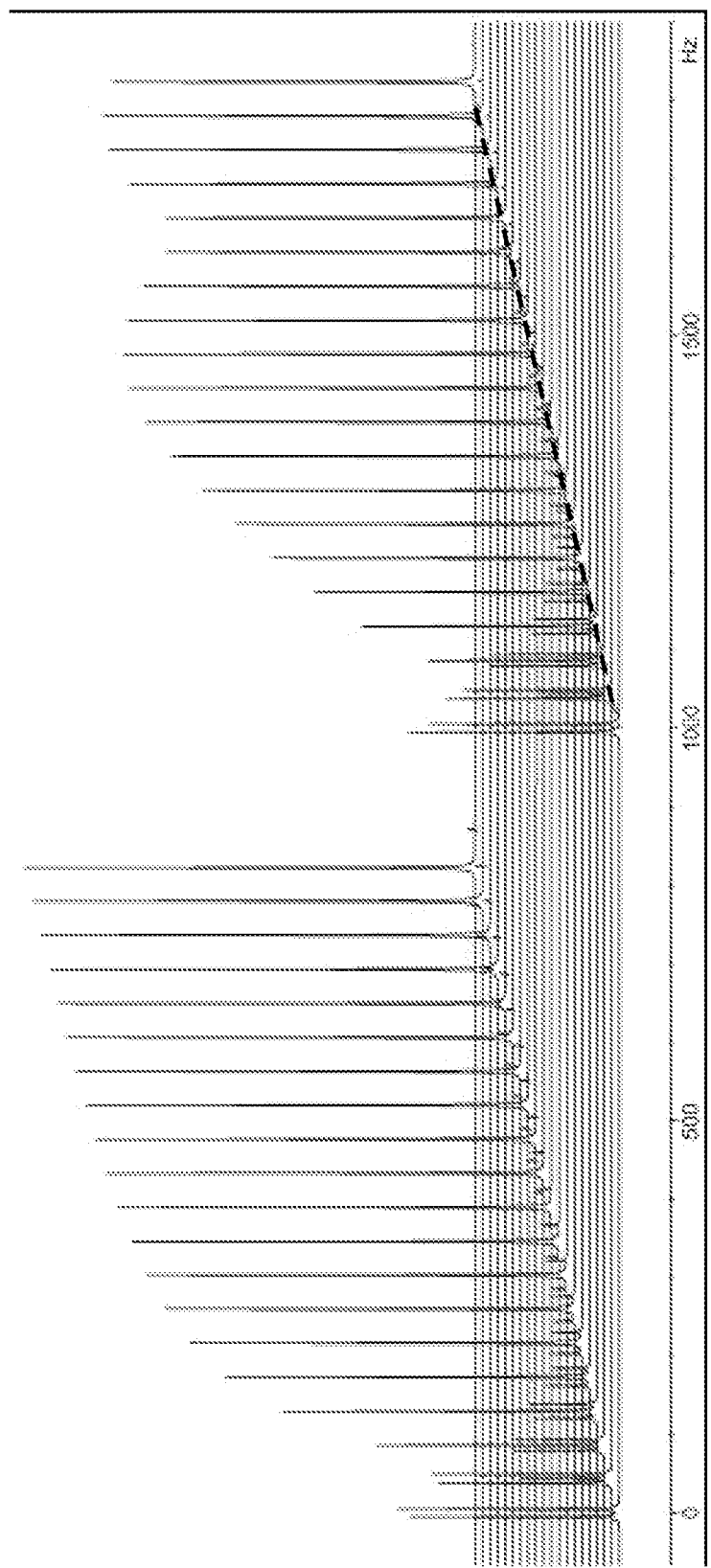
FIG. 5 Simulated tickling spectra stacked as in FIG. 4 but with 20 smaller steps of 0.25 kHz over a limited range $0 \le \omega_1/(2\pi) \le 4.75$ kHz with 1% duty cycle.

However, as may be appreciated in the blown-up view of FIG. 5, the tickling sidebands are largely suppressed in the range $2 < \omega_1/(2\pi) < 4$ kHz if $\tau_p=1$ μs and $\Omega_X/(2\pi)=1$ kHz. The efficiency of decoupling also depends on the offset of spin X. Numerical simulations indicate that decoupling fails in strongly-coupled spin systems, i.e., if the chemical-shift difference is smaller than, say, 10 Hz.

Figure 6:
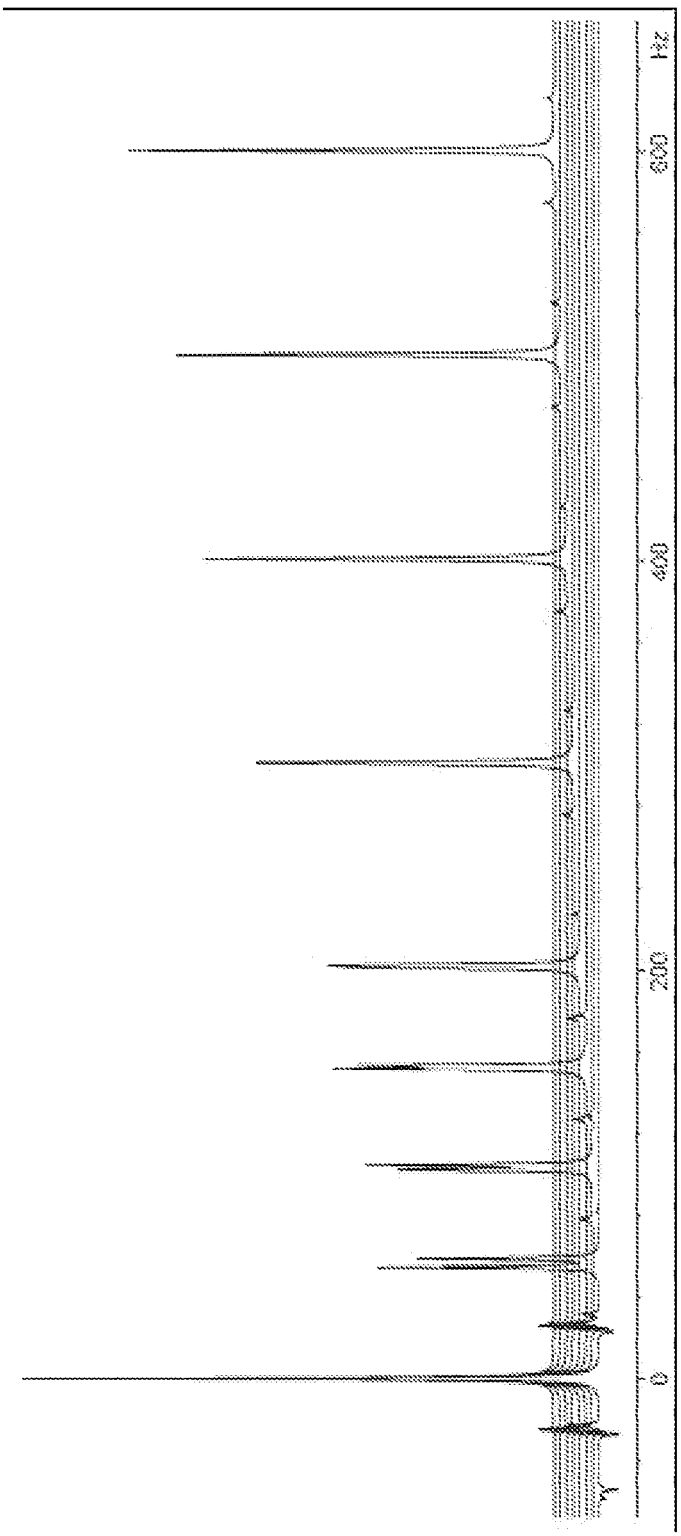
FIG. 6 Simulations for offset $\Omega_1/2\pi=0$ and $\Omega_S/2\pi=50, 100, 150, 200, 300, 400, 500$ and $600$ Hz, stacked from bottom to top. The tickling pulse length was $\tau_p=1$ µs. The tickling rf field strength $\omega_1/(2\pi)=2.5$ kHz, with a 1% duty cycle, and the J-coupling constant was $J_{AX}=10$ Hz. All spectra were processed with 1 Hz line broadening.

FIG. 6 shows a set of tickling spectra for offsets $50 < \Omega_X/(2\pi) < 600$ Hz with an rf field strength $\omega_1/(2\pi)=2.5$ kHz. A progressive improvement in decoupling, i.e., an increase of the intensity of the X signal is observed as the chemical shift difference is increased. The decoupling efficiency seems to be compromised when this difference is smaller than 100 Hz, i.e., smaller than 0.2 ppm at 500 MHz (11.7 T).

Figure 7:
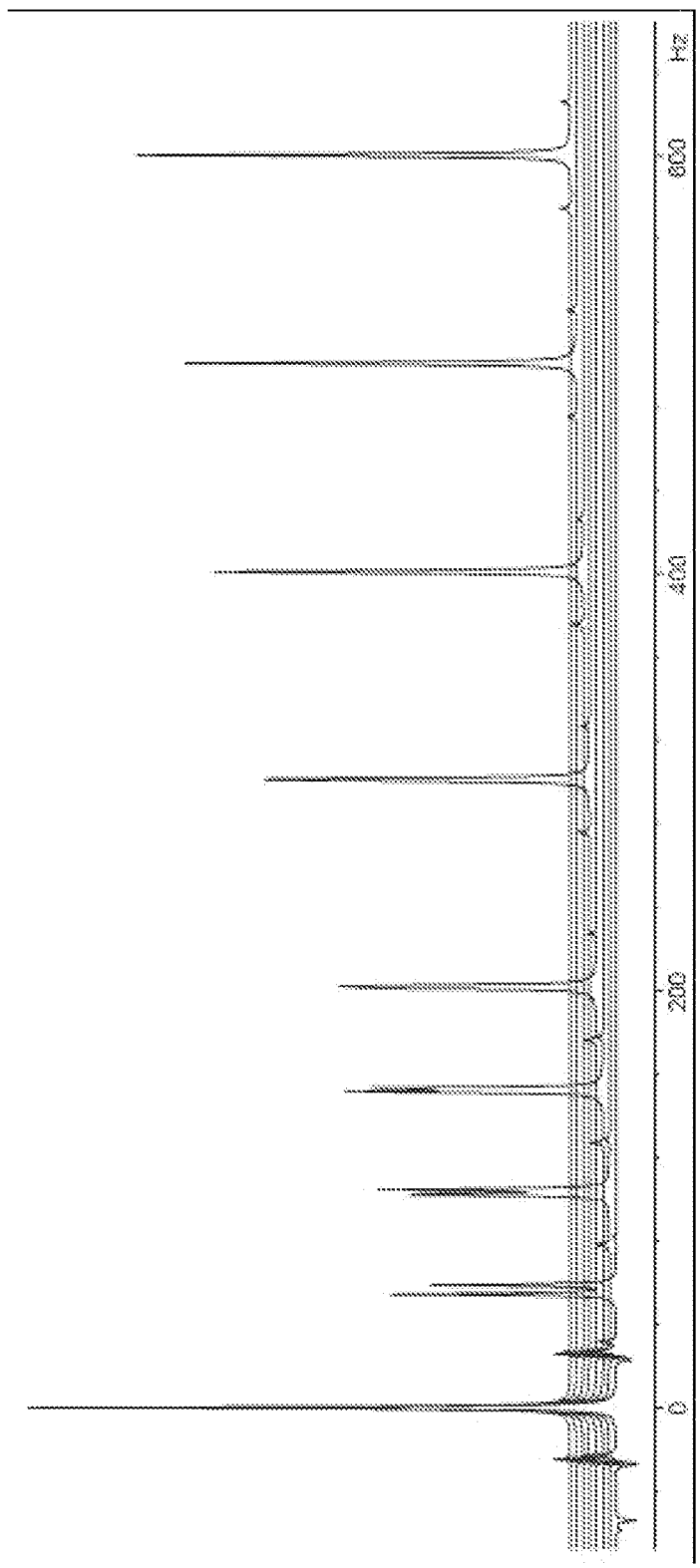
FIG. 7 Simulated spectra similar to FIG. 6, but for a weaker rf tickling field $\omega_1/(2\pi)=0.8$ kHz.

In FIG. 7 similar simulations are shown for a lower rf field strength $\omega_1/(2\pi)=800$ Hz, again with a 1% duty cycle. Although the intensities of the tickling sidebands are much larger than in FIG. 6, adequate decoupling can be achieved for offsets as small as 50 Hz, or 0.1 ppm at 500 MHz. Thus, paradoxically, weak rf tickling strengths are required to achieve efficient decoupling in strongly-coupled spin systems.

The decoupling effect of spin tickling can be rationalized in terms of Average Hamiltonian Theory.[21] Simulations performed with Mathematica[22] show that the decoupling effect is already observed when only the zeroth-order term of the Magnus expansion that describes the pulse sequence of FIG. 1 is considered. The matrix representation of this term in the product base of a two-spin system is:

$$\overline{H}^{(0)} = \begin{pmatrix} a & c & c & 0 \\ c & -a & a-b & c \\ c & a-b & b & c \\ 0 & c & c & -b \end{pmatrix}. \tag{5}$$

The off-diagonal elements $c=\omega_1\tau_p/(2\Delta t)=\langle\omega_1\rangle/2$ correspond to tickling pulses with phase x and are proportional to the duty cycle $\tau_p/\Delta t$. The other elements $a=(\Omega_X+\pi J)/2$ and $b=(\Omega_X-\pi J)/2$ describe the offset and J-coupling interactions and do not depend on the duty cycle since the evolution under these interactions occurs both during the free precession intervals and during the tickling-pulses. The eigenvalues of this matrix represent the energy levels of the two-spin system when the expectation values of the spin operators are sampled stroboscopically with a period $\Delta t$.

The transition frequencies are given by differences of eigenvalues. In the absence of tickling pulses, the frequency difference $\Delta v$ between the two single-quantum transitions associated with each spin amounts to the coupling constant $J_{AX}$, i.e., $\Delta v = 2\pi J_{AX}$. Identifying values of c which lead to a frequency difference $\Delta v(c)=0$ amounts to finding the condition where the $J_{AX}$-splitting collapses. Although the eigenvalues of $\overline{H}^{(0)}$ are rather involved, solving the equation $\Delta v(c)=0$ yields a compact result:

$$\langle \omega_1 \rangle = \omega_1 \frac{\tau_p}{\Delta t} = \pm \pi J_{AX}. \quad (6)$$

Thus, for a given coupling constant $J_{AX}$, it is possible to choose an average rf field strength $\langle \omega_1 \rangle$, i.e., a peak rf field strength w and a duration of the tickling pulses $\tau_p$ so that the splitting vanishes, provided the observation is periodic and occurs at intervals $\Delta t$. Equation 6 can be recast to give $\beta = \omega_1 \tau_p = \pm \pi J_{AX} \Delta t$. Thus, the flip angle $\beta$ of each tickling pulse must be equal to half the angle through which the single-quantum coherences of the two components of each doublet would evolve with respect to each other in the absence of any rf perturbation under the J-coupling interaction in the dwell time $\Delta t$.

Figure 8:
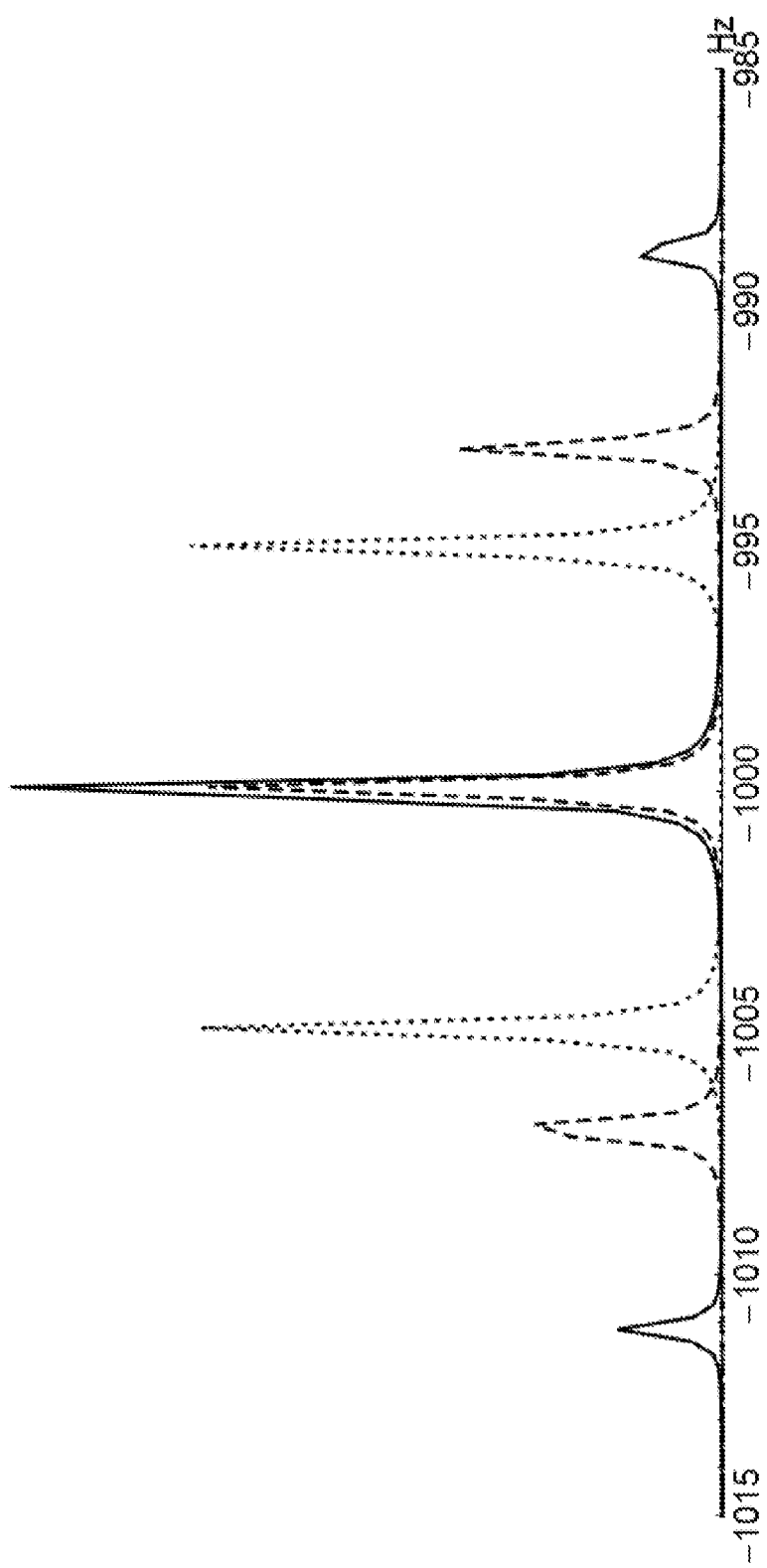
FIG. 8 Multiplets of the off-resonance spin X calculated by average Hamiltonian theory of Eq. 2 with $J_{AX}=10$ Hz and $\Delta t=100$ µs. Dashed black line: unperturbed doublet in the absence of rf irradiation. Broken black line: spectrum resulting from the use of tickling pulses of duration $\tau_p=1$ µs with an rf amplitude $\omega_1(2\pi)=0.5$ kHz to match the condition of Eq. 6. Black continuous line: improved spectrum resulting from using twice the rf amplitude, i.e., $\omega_1/(2\pi)=1$ kHz. A line broadening of 1 Hz was applied. Calculations were carried out with Mathematica;[22]

FIG. 8 shows numerical calculations of the multiplet of the off-resonance spin X using the average Hamiltonian of Eq.5 starting with an initial density operator $I_x^A + I_x^X$. The tickling pulse length was $\tau_p = 1$ μs and the coupling constant $J_{AX} = 10$ Hz. When $\omega_1/(2\pi)=0$ Hz, an unperturbed doublet is observed (black dotted line). The multiplet obtained when the condition of Eq.6 is met with $\tau_p = 1$ μs, $\Delta t = 100$ μs and $\omega_1/(2\pi)=0.5$ kHz, is shown by a broken line: a central peak with an intensity comparable to the peaks of the unperturbed spectrum appears at $\Omega_X = 1$ kHz, albeit slightly displaced by a small Bloch-Siegert effect. In addition, two tickling sidebands with intensities that are about half of the singlet peak appear. When the rf amplitude is increased to $\Omega_1/(2\pi)=1.0$ kHz (shown by a continuous line) the tickling sidebands move away symmetrically from $\Omega_X$ and lose intensity.

Although the condition $\Delta v(c)=0$ of Eq. 6 is violated by a factor of 2, the intensity of the central peak is enhanced. Thus, when the rf amplitude $\omega_1$ is increased, the splitting between the single-quantum transitions induced by a violation of Eq. 6 does not significantly broaden the central line, while the tickling sidebands are reduced. The integrals of all three spectra are conserved.

The requirement that the scalar coupling term in the average Hamiltonian of Eq. (1) be made ineffective (on the condition that the sampling be stroboscopic) implies that the degrees of freedom of the evolution of the density operator must be severely curtailed. In simple terms, if we start with in-phase terms such as $I_x^A$, $I_y^A$, $I_x^X$ and $I_y^X$, efficient decoupling means that it should be made impossible to convert these initial states into anti-phase terms such $2I_x^A I_z^X$, $2I_y^A I_z^X$, $2I_z^A I_x^X$ and $2I_z^A I_y^X$. It turns out that, if we start with $I_x^A$, and if the offset $\Omega_A$ vanishes, coherence transfer is constrained to a Liouville subspace spanned by a triad of non-commuting operators $\{I_x^A, 2I_y^A I_z^X, 2I_z^A I_z^X\}$.

Figure 9:
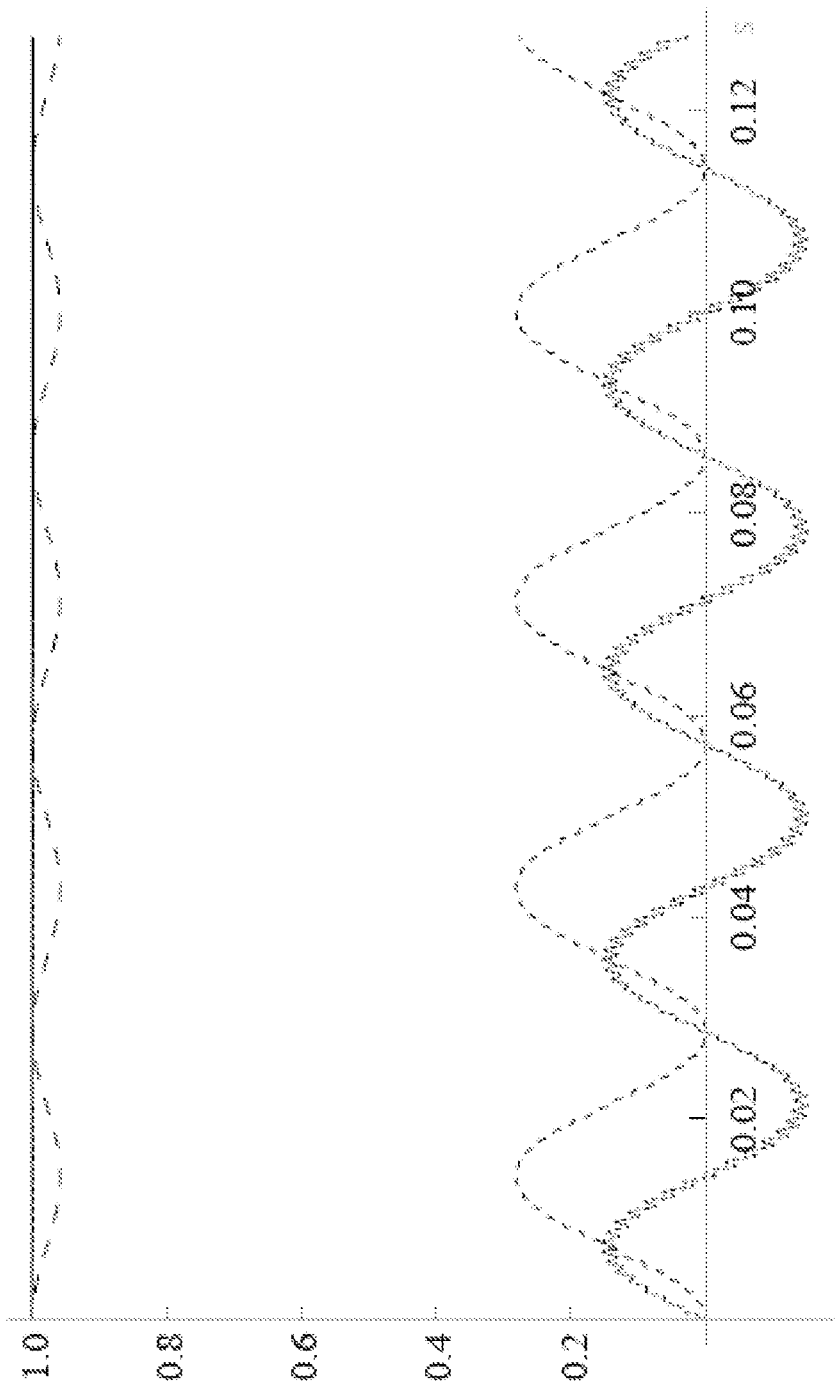
FIG. 9 Simulation of three product operators belonging to the subspace $\{I_x^A, 2I_y^A I_z^X, 2I_z^A I_z^X\}$ (shown as broken line with long bars, cross-line and broken line with short bars, respectively) in a two-spin system subjected to the Fourier tickling experiment of FIG. 1 with the following parameters: $\Omega_A/(2\pi)=0$, $\Omega_X/(2\pi)=1$ kHz, $J_{AX}=10$ Hz, $\omega_1/(2\pi)=3.5$ kHz, $\tau_p=1$ µs, $\Delta=100$ µs, for a duty cycle of 1%, and n=2522 observation points. The norm of these three operators (closed black line) is conserved, showing that the evolution is confined to this subspace. Upon Fourier transformation, the shallow amplitude modulation of the expectation value $\langle I_x^A \rangle$ gives rise to "tickling sidebands" as illustrated in FIG. 2. The simulations were performed with mPackages;[25]

FIG. 9 shows a simulation of the time dependence of these three product operators and of their norm, defined as $N=(\langle I_x^A \rangle^2 + \langle 2I_y^A I_z^X \rangle^2 + \langle 2I_z^A I_z^X \rangle^2)^{1/2}$ (continuous line) during a typical tickling experiment. Since the norm of these three operators is constant, coherence transfer must be confined to the subspace spanned by the triad of non-commuting operators. If we start with the in-phase term $I_x^A$, the J-coupling tends to convert it into an anti-phase operator $2I_y^A I_z^X$, but this process is stopped by the transformation of $2I_y^A I_z^X$ into longitudinal two-spin order $2I_z^A I_z^X$ due to the tickling pulses. As a result, the oscillations of the in-phase term $I_x^A$ are kept to a minimum. This amounts to successful decoupling.

Similar phenomena were observed in a different context and dubbed "stabilization by interconversion within a triad of coherences under multiple refocusing pulses" (SITCOM). [23, 24] Of course, in the tickling experiments presented here, the brief pulses do not have any refocusing effect, but the stabilizing effect is similar.

Although the analogies may seem far-fetched, Fourier tickling achieves similar effects as repeated projective measurements, where the system is not confined to a single state, but evolves under the action of its Hamiltonian in a multidimensional subspace of Hilbert space. It may be helpful to ponder about possible variants in the light of these analogies.[26-30]

All the experiments were carried out in a static field $B_0=11.7$ T (500 MHz for proton). At this field, the two protons of 2,3-dibromothiophene in DMSO-$d_6$ are weakly coupled with $(\Omega_A - \Omega_X)/(2\pi) \sim 305$ Hz and $J_{AX} \sim 5.8$ Hz.

Figure 10:
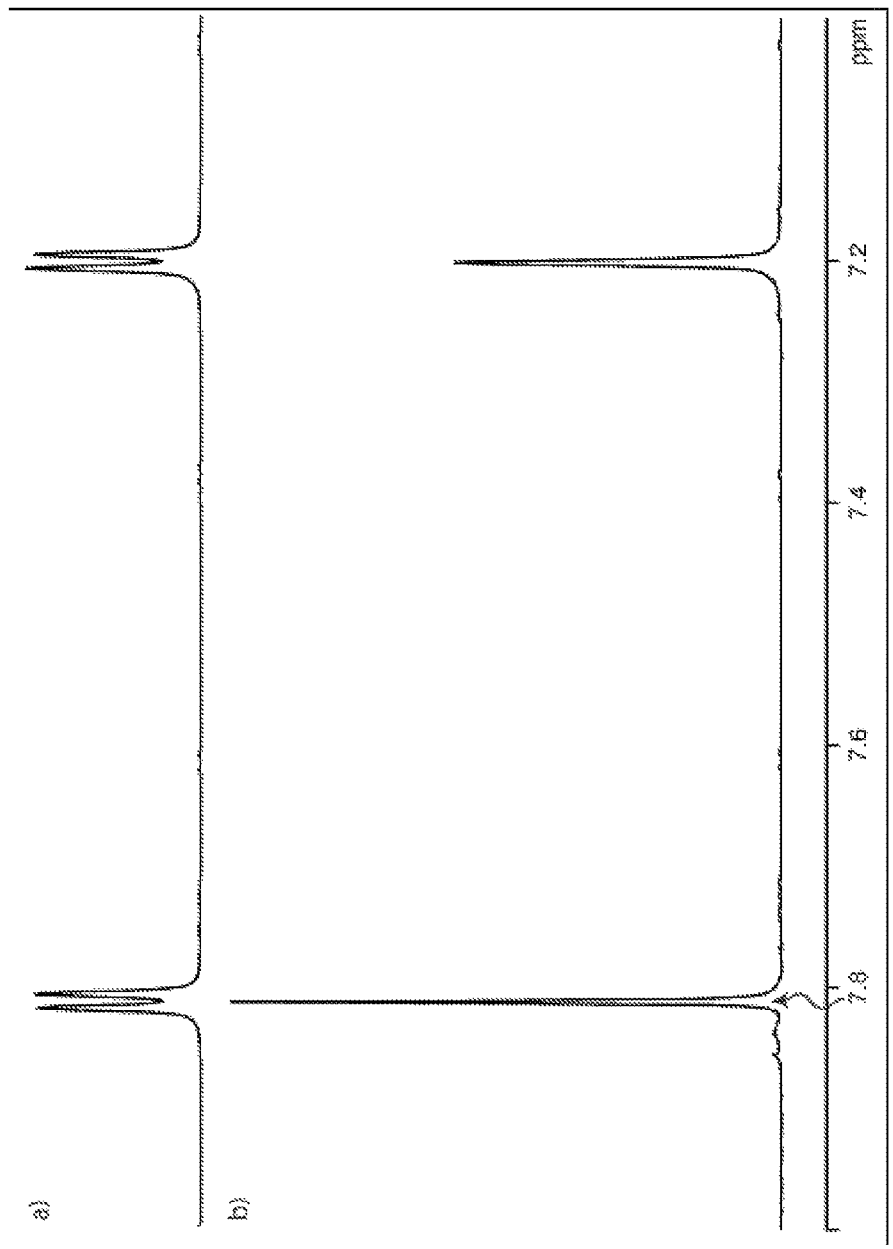
FIG. 10 a) Conventional NMR spectrum of 2,3-dibromothiophene in DMSO-$d_6$ at 500 MHz. b) Tickling spectrum of the same sample with the carrier frequency set on the left-hand doublet indicated by the wavy arrow. The difference between the two chemical shifts is 305 Hz and the coupling constant $J_{AX}=5.8$ Hz. The tickling-pulse length was $\tau_p=1$ µs for a dwell time $\Delta t=50$ µs (duty cycle 2%). The tickling field-strength was $\omega_1/(2\pi)=910$ Hz. Both spectra were processed with 1 Hz line broadening.

In FIG. 10, the unperturbed spectrum is compared with the best tickling spectrum. The carrier frequency was set on the left-hand resonance, as indicated by a wavy arrow. Good decoupling and minimal interference of tickling-sidebands is obtained with a tickling field strength that was empirically optimized to $\omega_1/(2\pi) \sim 900$ Hz.

Figure 11:
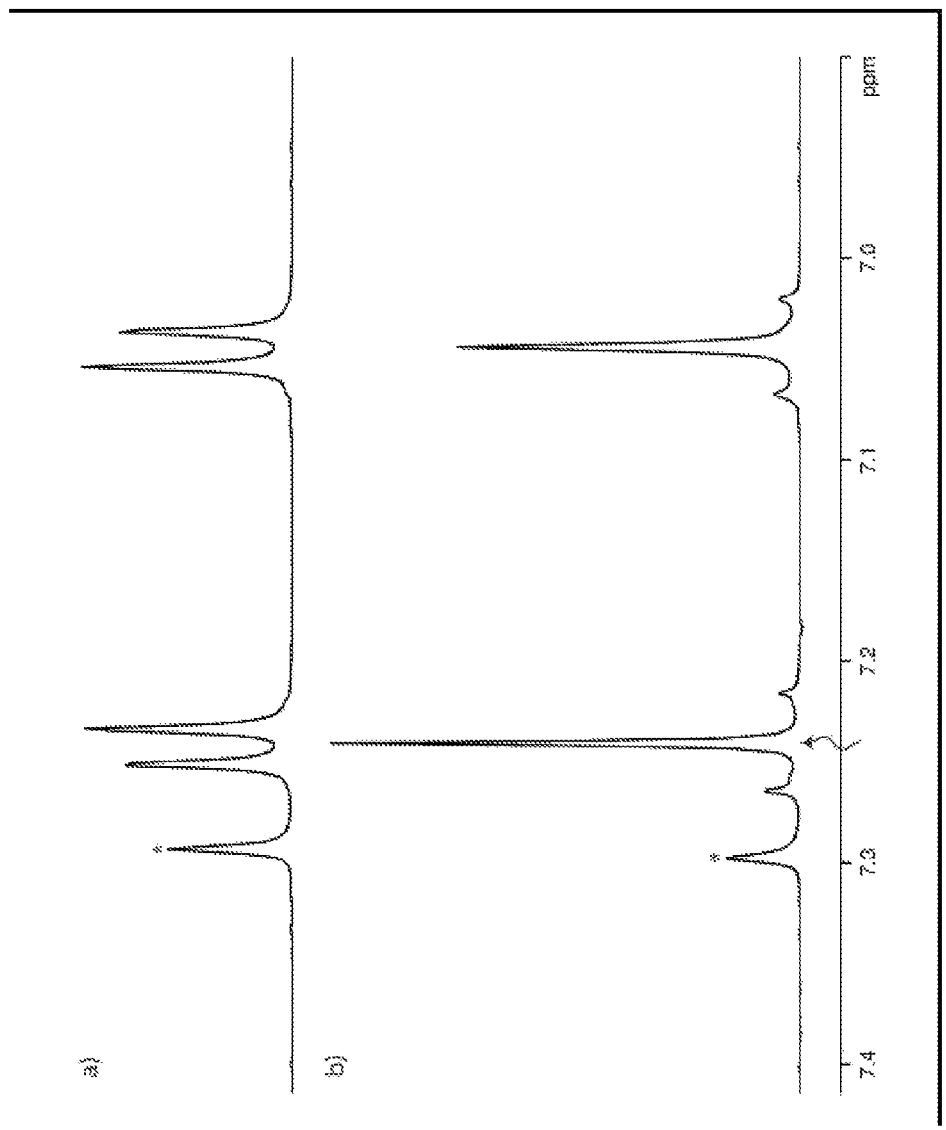
FIG. 11 a) Conventional NMR spectrum of 2,3,6-trichlorophenol in CDCl$_3$. b) Tickling spectrum of the same sample with the carrier frequency set on the resonance indicated by a wavy arrow. The difference between the two chemical shifts is 98 Hz and the coupling constant $J_{AX}=8.7$ Hz. The tickling-pulse length was $\tau_p=1$ µs for a dwell time $\Delta t=50$ µs (duty cycle 2%). The tickling field-strength was $\omega_1/(2\pi)=240$ Hz. Both spectra were processed with 1 Hz line broadening. The singlet at −7.3 ppm stems from the residual CHCl$_3$ of the solvent.

FIG. 11 shows spectra of the strongly-coupled AB system of 2,3,6-trichlorophenol superimposed with a solvent peak marked with an asterisk.

In contrast to the AX system of FIG. 10, some tickling sidebands are clearly visible in the strongly coupled AB system of FIG. 11. This undesirable effect was highlighted in the numerical simulations of FIG. 7.

Nevertheless, a reasonable decoupling efficiency is achieved. A lower rf-field amplitude must be used for smaller differences in chemical shifts. Tickling also works if the molecule comprises magnetically-equivalent spins, as in the $A_2M_2X_3$ system of propan-1-ol ($HOCH_2CH_2CH_3$).

Figure 12:
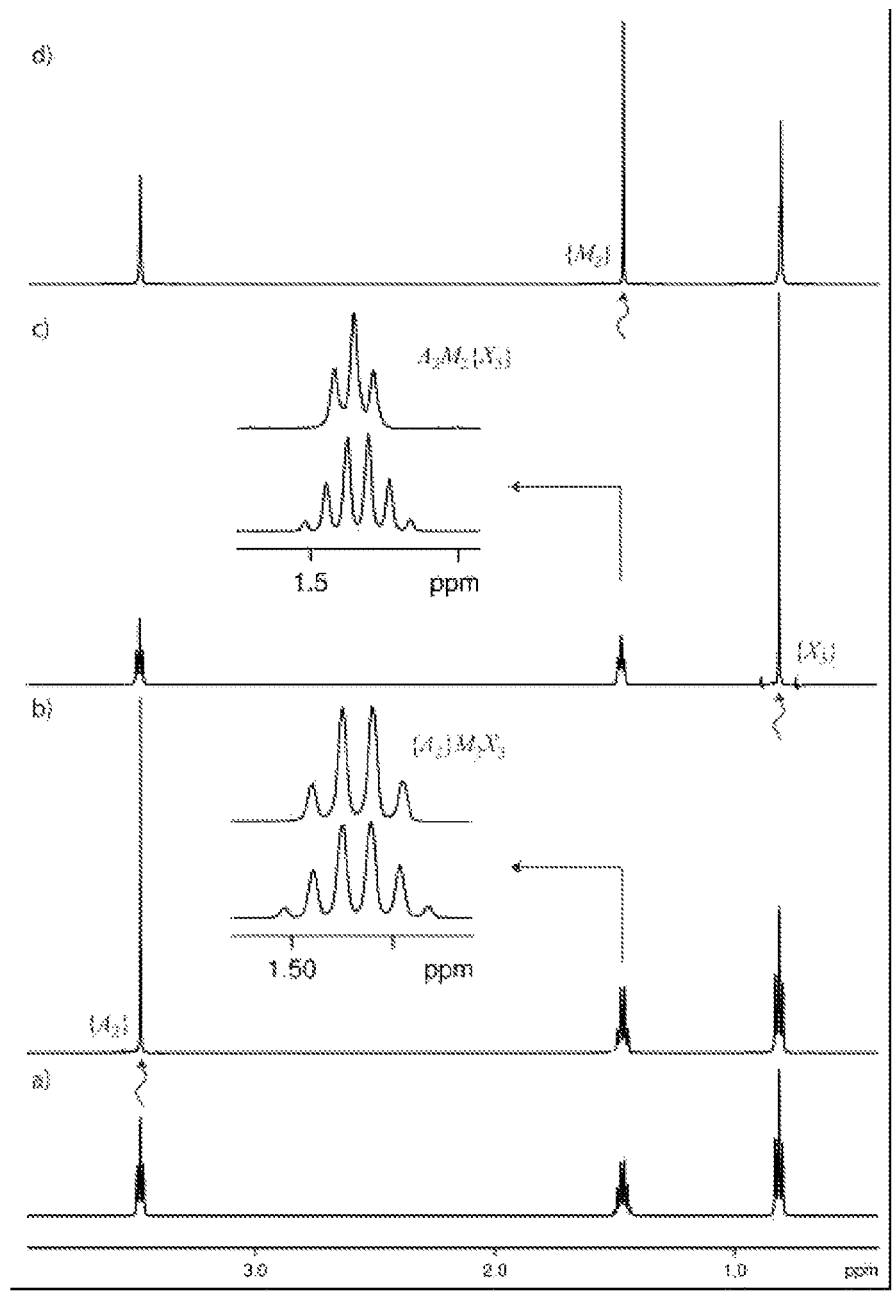
FIG. 12 a) Conventional NMR spectrum of the $A_2M_2X_3$ system of propan-1-ol in D$_2$O at 500 MHz. b) Tickling spectrum obtained if the carrier frequency (wavy arrow) is set on the $A_2$ resonance. The inset shows the simplification of the multiplet of the coupling partner $M_2$, which has become a simple quadruplet. c) Tickling spectrum with the carrier frequency (wavy arrow) set on the $X_3$ resonance. The inset shows the simplification of the multiplet of the coupling partner $M_2$, which now appears as a simple triplet. d) Tickling spectrum with the carrier frequency (wavy arrow) set on the central multiplet of $M_2$, leaving three fully decoupled singlets. The tickling-pulse length was $\tau_p=1$ µs and the tickling field strength was $\omega_1/(2\pi)=1.6$ kHz in all cases. All spectra were processed with 1 Hz line broadening except for the expansions shown in the insets, for which no line broadening was used.

The conventional spectrum and the tickling spectra with carrier frequencies set on one of the three multiplets are shown in FIG. 12. If the carrier frequency is set on the chemical shift of $A_2$, the multiplicity of the coupling partner $M_2$ is simplified by decoupling of the $^3J_{AM}$, though the fine structure due to the $^3J_{MX}$ is not affected, as shown in the inset. If the carrier frequency is set on the chemical shift of $X_3$, the multiplicity of the coupling partner $M_2$ is simplified by decoupling of $^3J_{XM}$ but the fine structure (triplet) due to $^3J_{AM}$ remains, as shown in the inset of FIG. 12 c. Clearly tickling can decouple all J-interactions between the irradiated spin and its J-coupling partners. Obviously, tickling does not affect couplings between spins that are not irradiated. In FIG. 12 d, the carrier frequency was set on the $M_2$ resonance of the $A_2M_2X_3$ system. Since the $M_2$ spins are coupled to both $A_2$ and $X_3$, while $^3J_{AX}=0$, all three resonances appear decoupled in this case. These results show that the presence of magnetically-equivalent spins does not compromise the performance of tickling experiments. Furthermore, in all three samples considered, we did not observe any anomalies of the integrals in the tickling spectra.

It is well known that the effective frequency of the centre-band of a comb C of pulses can be shifted at will from the carrier frequency $v_{rf}$ to $v=v_{rf}+\phi/(2\pi\Delta t)$ by advancing the phase of the $k^{th}$ pulse of the comb C in the $k^{th}$ dwell time $\Delta t$ through a shift $k\Delta\phi$. Such phase modulation schemes have been used in conjunction with so-called 'delays alternating with nutation for tailored excitation' (DANTE).[31-34] Since the position within the interval $\Delta t$ of the tickling pulses of duration $\tau_p$ belonging to any one comb C is immaterial, one can readily superimpose several combs $C_m$ of tickling pulses with m=1, 2, ... M, each of which may be associated with its own phase shift $k\Delta\phi_m$ and hence its own frequency shift. Each dwell time $\Delta t$ does contain only one tickling pulse per comb.

Figure 13:
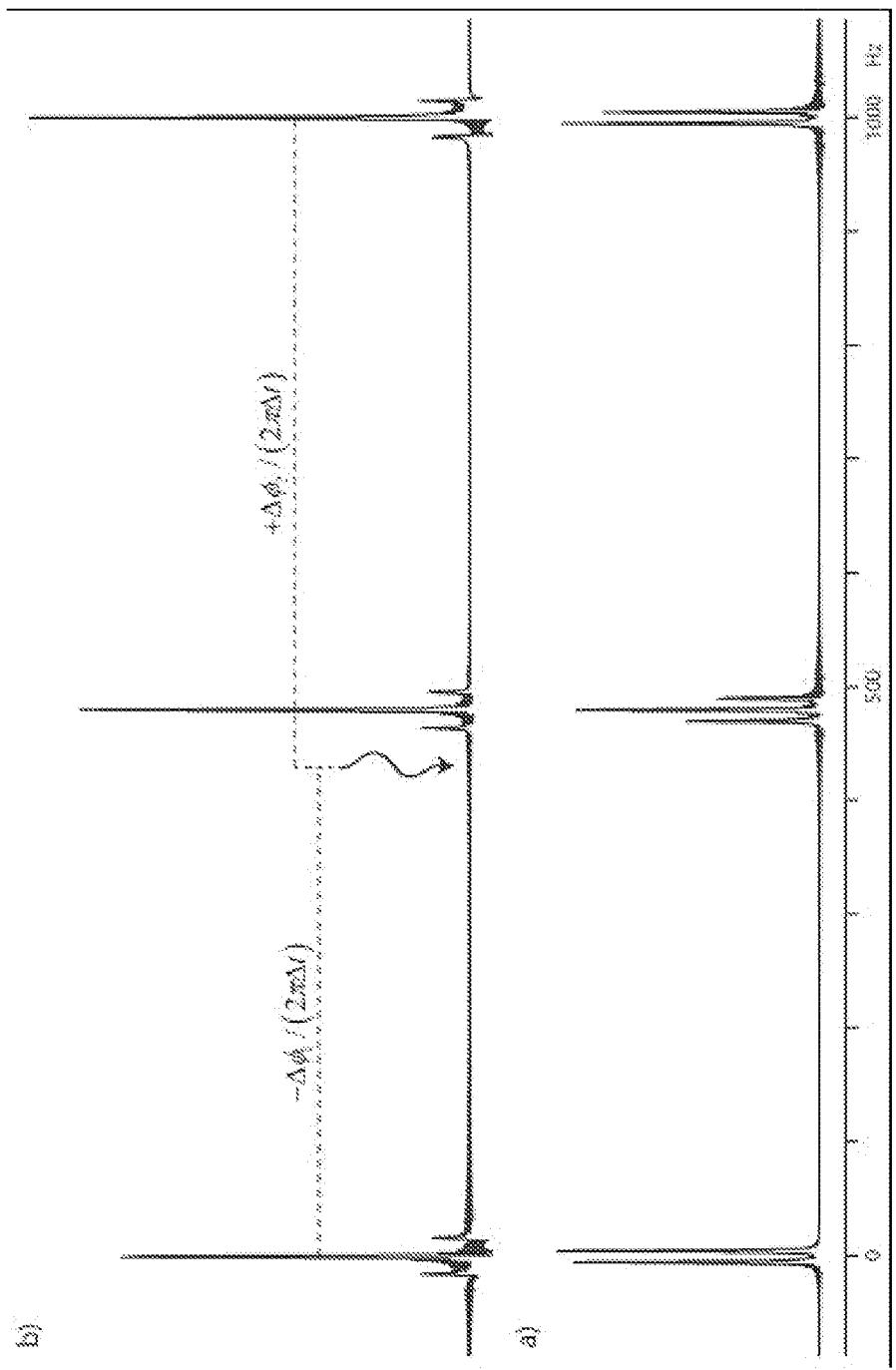
FIG. 13 a) Simulation of a conventional NMR spectrum of the AMX system at 400 MHz. b) Tickling spectrum obtained with a two-pulse tickling experiment where the carrier frequency (wavy arrow) is −40 Hz off resonance from the central resonance of spin M. A fully-decoupled spectrum is obtained by incrementing the phase of each tickling pulse according to the desired offset to be irradiated. The tickling-pulse lengths were $\tau_p=1$ µs for a duty cycle 1% and the tickling field strength was $\omega_1/(2\pi)=1.5$ kHz for both pulses. All spectra were processed with 1 Hz line broadening.

The tickling pulses within a dwell time Δt which belong to different combs $C_m$ do not need to be equidistant. This allows one in effect to irradiate simultaneously at a manifold of frequencies, as shown in the simulations of FIG. 13.

The method is effective over a broad range of chemical shifts. Groups of magnetically equivalent spins as occur in methylene and methyl groups can be decoupled efficiently. A considerable gain in resolution and spectral simplification can thus be obtained without distortion of signal integrals. We believe that this new experimental tool can aid the characterization of complex systems, including biological macromolecules. By inserting a manifold of polychromatic tickling pulses in each Δt interval, several subsystems can be decoupled simultaneously.

The new tickling method allows one to avoid interferences and allows irradiation at multiple frequencies to decouple several interactions simultaneously.

REFERENCES

[1] F. Bloch, Phys. Rev. 85, 1954, 944.
[2] A. L. Bloom and J. N. Shoolery, Phys. Rev. 97, 1955, 1261.
[3] R. Freeman and W. A. Anderson, J. Chem. Phys. 37, 1962, 2053.
[4] W. A. Anderson and R. Freeman, J. Chem. Phys. 37, 1962, 85.
[5] J. A. Elvidge and L. M. Jackman, J. Chem. Soc., 1961, 859.
[6] J. P. Maher and D. F. Evans, Proc. Chem. Soc., 1961, 208.
[7] R. A. Hoffman and S. Forsen, Prog. NMR Spectrosc. 1, 1966, 15.
[8] R. R. Ernst, G. Bodenhausen and A. Wokaun, Principles of Nuclear Magnetic Resonance in One and Two Dimensions, Clarendon Press Oxford, 1987, Chapter 4.
[9] W. P. Aue, J. Karhan and R. R. Ernst, J. Chem. Phys., 1976, 64, 4226.
[10] A. Bax, R. Freeman and G. A. Morris, J. Magn. Reson., 1981, 43, 333.
[11] J. R. Garbow, D. P. Weitekamp and A. Pines, Chem Phys. Lett., 1982, 93, 504.
[12] A. J. Shaka, J. Keeler and R. Freeman, J. Magn. Reson., 1984, 56, 294.
[13] M. Rance, G. Wagner, O. W. Sørensen, K. Wüthrich and R. R. Ernst, J. Magn. Reson., 1984, 59, 250.
[14] O. W. Sørensen, C. Griesinger and R. R. Ernst, J. Am. Chem. Soc., 1985, 107, 7778.
[15] K. Zangger and H. Sterk, J. Magn. Reson., 1997, 124, 486.
[16] M. Bak, J. T. Rasmussen and N, C. Nielsen, J. Magn. Reson. 147, 2, 2000.
[17] R. R. Ernst, G. Bodenhausen and A. Wokaun, Principles of Nuclear Magnetic Resonance in One and Two Dimensions, Clarendon Press Oxford, 1987, Chapter 2.
[18] F. Bloch and A. Siegert, Phys. Rev., 1940, 57, 522.
[19] L. Emsley and G. Bodenhausen, Chem. Phys. Lett., 1990, 168, 297.
[20] K. T. Summanen, Phys. Lett. A., 1991, 155, 335.
[21] U. Haeberlen and J. S. Waugh, Phys. Rev., 1968, 175, 453.
[22] Wolfram Research, Inc., Mathematica 7.0, Wolfram Research Inc., Champain, 2008.
[23] J. Dittmer and G. Bodenhausen, ChemPhysChem., 2004, 5, 1750.
[24] J. Dittmer and G. Bodenhausen, ChemPhysChem., 2006, 7, 831.
[25] mPackages code for Mathematica, programmed by Malcolm H. Levitt, available at www.mhl.soton.ac.uk.
[26] B. Misra and E. C. G. Sudarshan, J. Math. Phys., 1977, 18, 756.
[27] H. Nakazato, M. Namiki, S. Pascazio and H. Rauch, Phys. Lett. A 1995, 199, 27.
[28] D. Home and M. A. B. Whitaker, Annals of Physics 258, 1997, 237.
[29] K. Koshino and A. Shimizu, Physics Reports 412, 2005, 191.
[30] J. M. Raimond, C. Sayrin, S. Gleyzes, I. Dotsenko, M. Brune, S. Haroche, P. Facchi and S. Pascazio, Phys. Rev. Lett. 105, 2010, 213601.
[31] G. Bodenhausen and R. Freeman and G. A. Morris, J. Magn. Reson. 23, 1976, 171.
[32] G. A. Morris and R. Freeman, J. Magn. Reson. 29, 1978, 433.
[33] P. Caravatti, G. Bodenhausen and R. R. Ernst, J. Magn. Reson. 55, 1983, 88.
[34] V. Vitzthum, M. Caporini, S. Ulzega and G. Bodenhausen, J. Magn. Reson., in press.

We claim:

1. A method for high resolution NMR (=nuclear magnetic resonance) measurements, the method comprising the steps of:
    a) applying an excitation pulse;
    b) acquiring a first data point;
    c) waiting a dwell time Δt;
    d) applying, during step c), one or more tickling rf (=radio frequency) pulses of duration $\tau_p$, each tickling rf pulse having an average rf field amplitude between $\langle \omega_1 \rangle = \omega_1 \tau_p / \Delta t = \pi/_{10} J$ and $\langle \omega_1 \rangle = \omega_1 \tau_p / \Delta t = 10\pi J$, wherein J is a scalar J-coupling constant and $\omega_1 = \gamma B_1$ with γ being a gyromagnetic ratio and $B_1$ being a strength of a magnetic component of each tickling rf pulse; and
    e) acquiring a second data point immediately following completion of step c), the dwell time Δt thereby separating acquisition of the first and the second data points.

2. The method of claim 1, wherein an average rf field amplitude of each of the tickling rf pulses fulfills the condition: $\langle \omega_1 \rangle = \omega_1 \tau_p / \Delta t = \pi J$.

3. The method of claim 1, wherein the duration $\tau_p$ of the tickling pulses is between 0.1 μs and 20 μs.

4. The method of claim 3, wherein the duration $\tau_p$ of the tickling pulses is about 1 μs.

5. The method of claim 1, wherein data points, acquired once in every dwell time Δt, are transformed into a spectrum by a Fourier transformation.

6. The method of claim 1, wherein M tickling rf pulses of duration $\tau_p$ are applied at will within each of multiple dwell times Δt, each tickling rf pulse within each dwell time Δt belonging to a different comb $C_m$ of tickling rf pulses, wherein m is a positive integer and 1≤m≤M, all tickling rf pulses belonging to a same comb $C_m$ being equidistant from each other.

7. The method of claim 6, wherein a phase of each tickling rf pulse belonging to the same comb $C_m$ is shifted from one dwell time to a next by a constant factor.

* * * * *

UNITED STATES PATENT AND TRADEMARK OFFICE
CERTIFICATE OF CORRECTION

PATENT NO. : 9,086,465 B2
APPLICATION NO. : 13/545995
DATED : July 21, 2015
INVENTOR(S) : Bodenhausen et al.

Page 1 of 1

It is certified that error appears in the above-identified patent and that said Letters Patent is hereby corrected as shown below:

Title Page, Item (73) Assignee should read

(73) Assignees: Bruker BioSpin AG, Faellanden (CH);
Ecole Polytechnique Fédérale de Lausanne EPFL-TTO, Lausanne (CH)

Signed and Sealed this
Twenty-ninth Day of December, 2015

Michelle K. Lee
*Director of the United States Patent and Trademark Office*